United States Patent
Jung et al.

(10) Patent No.: US 11,404,467 B2
(45) Date of Patent: Aug. 2, 2022

(54) IMAGE SENSOR AND SYSTEM INCLUDING THE IMAGE SENSOR

(71) Applicant: Samsung Electronics Co., Ltd., Suwon-si (KR)

(72) Inventors: Seungki Jung, Bucheon-si (KR); Eunsub Shim, Hwaseong-si (KR); Kyungho Lee, Suwon-si (KR); Sungsoo Choi, Hwaseong-si (KR); Sanghyuck Moon, Gwangju (KR); Hongsuk Lee, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 220 days.

(21) Appl. No.: 16/786,712

(22) Filed: Feb. 10, 2020

(65) Prior Publication Data
US 2020/0321383 A1    Oct. 8, 2020

(30) Foreign Application Priority Data

Apr. 8, 2019  (KR) .................... 10-2019-0041053

(51) Int. Cl.
| | | |
|---|---|---|
| *H01L 27/146* | (2006.01) | |
| *H04N 5/374* | (2011.01) | |
| *H04N 5/369* | (2011.01) | |
| *H04N 5/378* | (2011.01) | |

(52) U.S. Cl.
CPC .. *H01L 27/14636* (2013.01); *H01L 27/14634* (2013.01); *H04N 5/374* (2013.01); *H04N 5/378* (2013.01); *H04N 5/379* (2018.08)

(58) Field of Classification Search
CPC ........ H01L 27/14636; H01L 27/14634; H04N 5/374; H04N 5/378; H04N 5/379
See application file for complete search history.

(56) References Cited

U.S. PATENT DOCUMENTS

| | | | |
|---|---|---|---|
| 7,355,385 | B2 | 4/2008 | Zentai |
| 7,470,882 | B2 | 12/2008 | Ay |
| 9,548,755 | B2 | 1/2017 | Huang et al. |
| 9,818,659 | B2 | 11/2017 | Bishop |
| 9,984,992 | B2 | 5/2018 | Delacruz et al. |
| 10,084,983 | B2 | 9/2018 | Fahim et al. |
| 2008/0023783 | A1 | 1/2008 | Ay |
| 2017/0033141 | A1* | 2/2017 | Sugihara ........... H01L 27/14645 |

* cited by examiner

*Primary Examiner* — Tony Ko

(74) *Attorney, Agent, or Firm* — Muir Patent Law, PLLC

(57) ABSTRACT

An image sensor includes: a pixel array outputting a pixel signal; and a column wiring unit including at least one first column routing wiring extending from the pixel array and including a first connection wiring portion and a protrusion and at least one second column routing wiring including a second connection wiring portion, wherein a sum of lengths of the at least one first connection wiring portion and the protrusion is substantially identical to a length of the at least one second connection wiring portion; and a readout circuit receiving the pixel signal from the column wiring unit.

20 Claims, 14 Drawing Sheets

IMAGE SENSOR AND SYSTEM INCLUDING THE IMAGE SENSOR

CROSS-REFERENCE TO RELATED APPLICATION

This application claims the benefit of priority under 35 U.S.C. § 119 to Korean Patent Application No. 10-2019-0041053, filed on Apr. 8, 2019, in the Korean Intellectual Property Office, the disclosure of which is incorporated herein in its entirety by reference.

BACKGROUND

The inventive concept relates to an image sensor, and more particularly, to an image sensor in which wirings extending from a pixel array form a spider routing structure.

An image sensor is an apparatus for capturing a two-dimensional or a three-dimensional image of an object. The image sensor generates an image of the object by using a photoelectric conversion device that responds to the intensity of light reflected from the object. According to the development of complementary metal-oxide semiconductor (CMOS) technology, CMOS sensors using CMOS are widely used. As electronic devices become smaller, the sizes of image sensors also decrease and accordingly, the sizes of various circuits included in the image sensors decrease.

SUMMARY

When a pixel array and a readout circuit respectively have different sizes, wires extending from the pixel array may respectively have different lengths. The inventive concept provides a method of minimizing differences in settling times of signals transmitted to wires that respectively have different lengths.

According to an aspect of the inventive concept, the disclosure is directed to an image sensor comprising: a pixel array configured to output a pixel signal; a column wiring unit extending from the pixel array and comprising a first column routing wire comprising a first connection wiring portion and a protrusion portion, and a second column routing wire comprising a second connection wiring portion, wherein a sum of lengths of the first connection wiring portion and the protrusion portion of the first column routing wire is the same as a length of the second connection wiring portion of the second column routing wire; and a readout circuit configured to receive the pixel signal output from the column wiring unit.

According to an aspect of the inventive concept, the disclosure is directed to an image sensor comprising: a pixel array configured to output a pixel signal and comprising a plurality of pixels arranged in rows and columns; a column wiring unit comprising a first column routing wire formed in a column direction, and a second column routing wire comprising at least one first partial wire formed in the column direction and at least one second partial wire formed in a diagonal direction; and a readout circuit configured to receive the pixel signal output from the column wiring unit.

According to an aspect of the inventive concept, the disclosure is directed to a system comprising: a processor; and an image sensor controlled by the processor, wherein the image sensor comprises: a first semiconductor die comprising a pixel array configured to output a pixel signal, a first column wiring unit configured to transmit the pixel signal, and a first interlayer connection unit configured to transmit the pixel signal received from the first column wiring unit; and a second semiconductor die comprising a second interlayer connection unit configured to receive the pixel signal from the first interlayer connection unit, a second column wiring unit configured to transmit the pixel signal received from the second interlayer connection unit, and a readout circuit configured to receive the pixel signal from the second column wiring unit, wherein at least one wiring from wirings included in the first column wiring unit and the second column wiring unit comprises at least one of a protrusion portion or a partial wiring formed in a diagonal direction.

In an image sensor according to an example embodiment of the inventive concept, column routing wirings extending from a pixel array may include protrusion portions respectively having different lengths. Accordingly, difference between capacitances formed according to columns may be reduced, and difference between settling times may be minimized.

In an image sensor according to an example embodiment of the inventive concept, by forming a partial wiring in a diagonal direction in a column routing wiring that has a long distance from the pixel array to a readout circuit, differences between capacitances generated according to columns may be reduced, and differences in settling time may be minimized.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
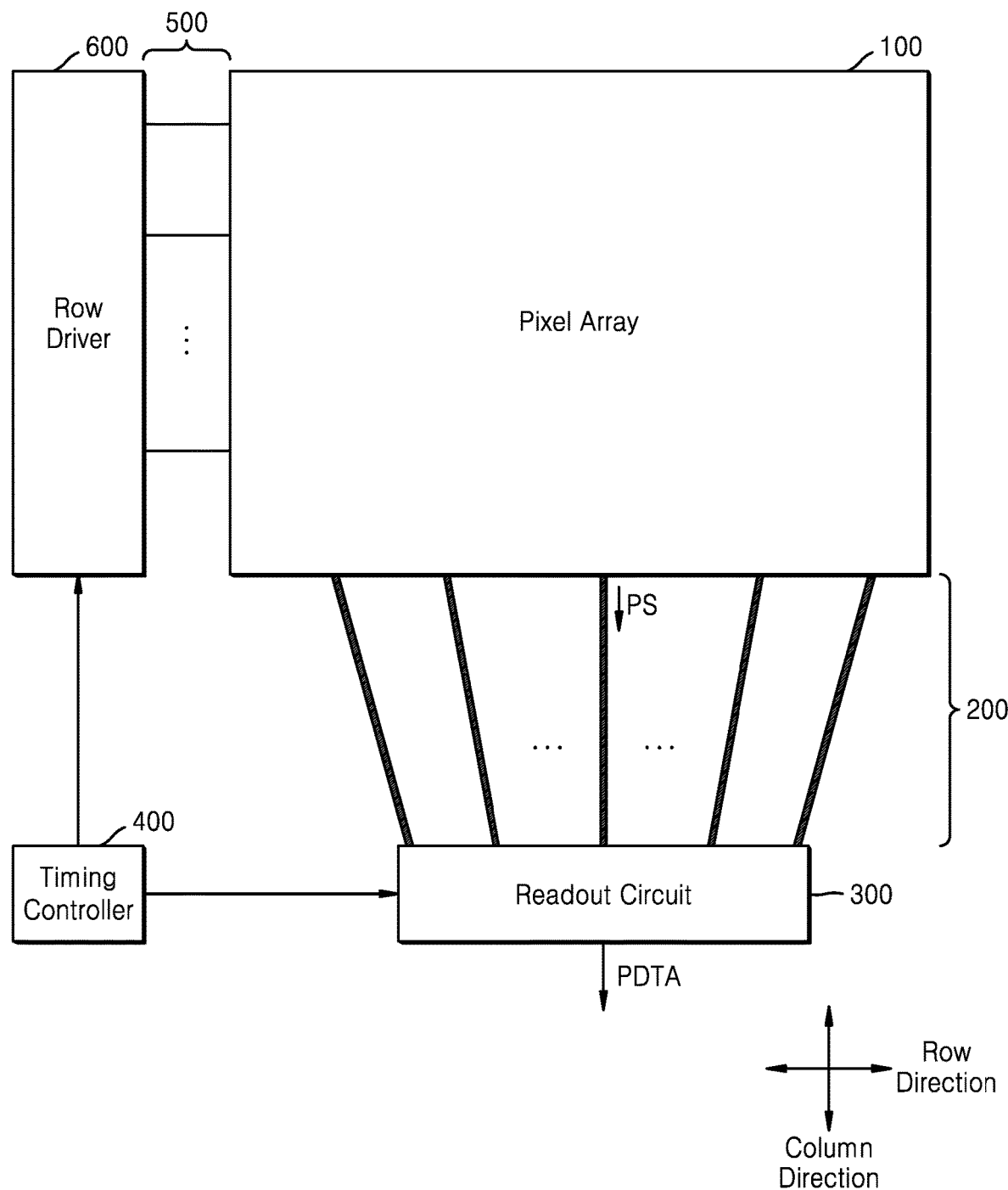
FIG. 1 is a diagram of an image sensor according to an example embodiment of the inventive concept.

FIG. 1 is a diagram of an image sensor 1 according to an example embodiment of the inventive concept.

Referring to FIG. 1, the image sensor 1 may include a pixel array 100, a column wiring unit 200, a readout circuit 300, a timing controller 400, a row wiring unit 500, and a row driver 600.

Referring to FIG. 1, the pixel array 100 may receive a control signal from the row driver 600 through the row wiring unit 500. The timing controller 400 may control the row driver 600 to control a timing of a pixel signal PS output by the pixel array 100. The pixel array 100 may, in response to the received control signal, output the pixel signal PS to the readout circuit 300 through the column wiring unit 200. In response to the control signal received from the timing controller 400, the readout circuit 300 may digitize the pixel signal PS, which is an analog signal, to output pixel data PDTA.

The pixel array 100 may include a plurality of pixels arranged in the form of a matrix. Each of the plurality of pixels may include a plurality of sub-pixels. Each of the plurality of sub-pixels may include a light sensing device, for example, a photodiode. The light sensing device may generate a photocurrent by using light that is incident from outside. The plurality of pixels may convert the photocurrent into a voltage signal or a current signal to output the pixel signal PS.

The column wiring unit 200 may be configured to transmit the pixel signal PS output by the pixel array 100. For example, the column wiring unit 200 may directly transmit the pixel signal PS to the readout circuit 300, and as another embodiment, the column wiring unit 200 may transmit the pixel signal PS to the readout circuit 300 through an interlayer connection unit (for example, the first interlayer connection unit 210 or the second interlayer connection unit 220) (see FIGS. 6 and 7). As another example embodiment, the column wiring unit 200 may transmit the pixel signal PS to the readout circuit 300 through a data pin, a pad, a contact metal, and the like.

The column wiring unit 200 may have a spider routing structure. In the spider routing structure, when row-direction lengths of the pixel array 100 and the readout circuit 300 are different from each other, lengths of at least some of column routing wires (e.g., a column routing wires RT in FIG. 2) extending from the pixel array 100 are different from each other. For example, a column routing wire extending from a first pixel located in a central region of the pixel array 100 has a shorter distance to reach the readout circuit 300 and may be formed as a straight line. As another example, a column routing wire extending from a second pixel located in a side region of the pixel array 100 has a longer distance to reach the readout circuit 300 and may be formed as a diagonal line. The side regions of the pixel array 100 may be the boundary regions of the pixel array 100 in the row directions. For example, the side regions of the pixel array 100 may include the pixels (PX in FIG. 2) connected to the first and last column lines (CL in FIG. 2). The central region of the pixel array 100 may be the center region of the pixel array 100 in the row directions. For example, the central region of the pixel array 100 may include the pixels PX connected to the column lines CL that are midway between the first and last column lines CL.

When the column wiring unit 200 has the spider routing structure, the column routing wires may respectively have different lengths, and accordingly, a difference may occur between settling times of pixel signals PS respectively transmitted through the column routing wires. The difference between the settling times may cause fixed pattern noise (FPN) (e.g., noise in a column direction). As used herein, the column direction may correspond to the columns of pixels PX, and the row direction may correspond to the rows of pixels PX.

Therefore, according to an example embodiment of the inventive concept, a protrusion portion may be connected to a column wire having a short length. According to another embodiment, the column wiring may be formed to include a partial wire extending in the diagonal direction. According to another embodiment, the column wire may include both the protrusion portion and the partial wire in the diagonal direction. By doing so, differences between the lengths of the column wires may be minimized to minimize the settling time. Specific embodiments will be described with reference to the following drawings.

The readout circuit 300 may perform a binning operation, a correlated double sampling operation, and an analog-digital converting operation, and may include hardware and/or software for performing the above-mentioned operations. In addition, the readout circuit 300 may further include a buffer. The buffer may, for example, amplify and output a received signal.

According to an example embodiment of the inventive concept, the readout circuit 300 may include a correlated double sampling circuit. For example, the image sensor 1 may include a lamp generator, which outputs a lamp signal, and a comparator. The comparator may compare the pixel signal PS, which is input through the column wiring unit 200, to the lamp signal. For example, each wire included in the column wiring unit 200 may be connected to the comparator included in the correlated double sampling circuit.

The readout circuit 300 may output pixel data PDTA to an image processor included in an inner portion or external portion of the image sensor 1. The image processor, based on the received pixel data PDTA, may perform a digital binning operation, a noise reduction process, gain adjustment, a waveform shaping process, an interpolation process, a white balance process, a gamma process, an edge enhancement process, and the like.

The timing controller 400 may control the row driver 600 by providing a control signal to the row driver 600 to control the pixel array 100 to absorb light and accumulate currents, temporarily store the accumulated currents, and output an electrical signal according to the stored currents to an external region of the pixel array 100.

The row driver 600 may generate control signals to control the pixel array 100 and provide the control signals to a plurality of pixels through the row wiring unit 500. For example, the control signal may determine activation timings and deactivation timings of a reset control signal, a transmission control signal, and a selection signal, and each control signal may control a plurality of transistors included in a pixel.

Figure 2:
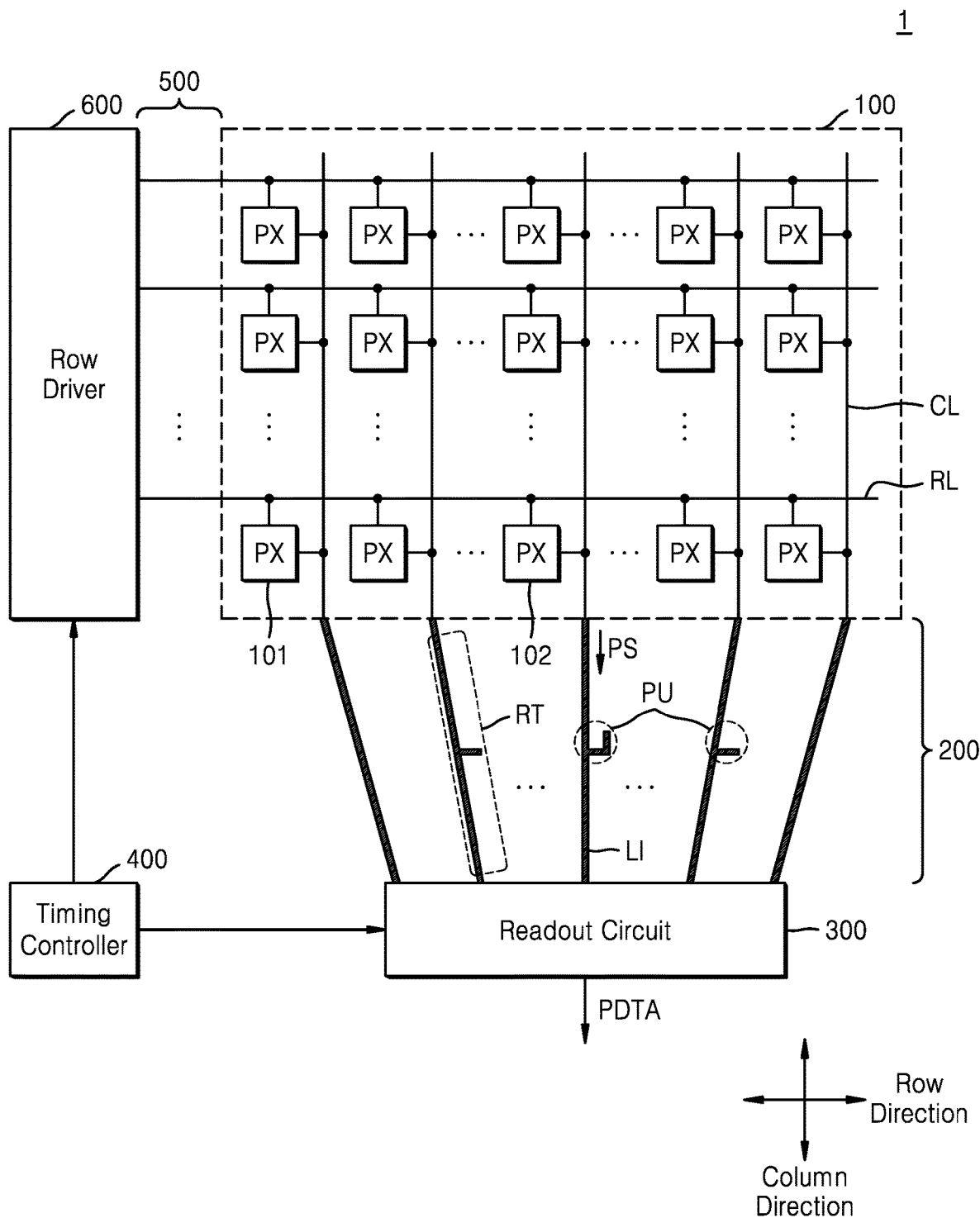
FIG. 2 is a diagram of an image sensor including a protrusion portion, according to an example embodiment of the inventive concept.

FIG. 2 is a diagram of the image sensor 1 including the protrusion portion PU according to an embodiment of the inventive concept.

Referring to FIG. 2, the pixel array 100 may include a plurality of pixels PX, and the plurality of pixels may each be connected to a row line RL and a column line CL. Each pixel PX may receive various control signals through the row line RL and output a pixel signal PS based on a photocurrent or a photovoltage through the column line CL.

The column wiring unit 200 may include a column routing wire RT, and the column routing wire RT may include only a connection wiring portion LI or include both the connection wiring portion LI and a protrusion portion PU. The protrusion portion PU may be a length of wiring that is connected on one end to the connection wiring portion LI and floating on another end. According to the spider routing structure, a length of a column routing wire RT from a pixel (e.g., a pixel 101) arranged at a side region in the row direction from the readout circuit may be longer, and a length of a column routing wire RT from a pixel (e.g., a pixel 102) arranged in a central area to the readout circuit 300 may be shorter. In this case, values of a resistance and a capacitance according to the column routing wire RT extending from the pixel arranged in the side region may be greater, and values of a resistance and a capacitance according to the column routing wire RT extending from the pixel in the central region may be smaller. Due to differences between the lengths of the column routing wires RT, the column routing wires RT may respectively have different time constants, deviation between settling times may occur, and as a result, pixel noise may occur. Therefore, the protrusion portion PU may be included in the column routing wire RT to minimize the deviation between the lengths of the column routing wires RT. For example, the protrusion portion PU may increase the length of wiring (e.g., amount of wiring) of shorter column routing wires RT, such that the difference in the lengths of wiring among the column routing wires RT is decreased.

The connection wiring portion LI indicates a wire form, pattern, structure, or material configured to substantially transmit a pixel signal PS output from each pixel PX to the readout circuit 300.

The protrusion portion PU may protrude from the connection wiring portion LI and formed between the column routing wires RT adjacent to each other, and may be formed through a process such as patterning, etching, depositing, and printing.

According to an embodiment of the inventive concept, the connection wiring portion LI and the protrusion portion PU may be integrally formed of a same material (for example, a metal). For example, the connection wiring portion LI and the protrusion portion PU may be formed at the same time and of the same material, without a break in the continuity of the material of which they are formed. As another example, the connection wiring portion LI and the protrusion portion PU may include a same material but respectively have individual structures, and each of the connection wiring portions LI and the protrusion portions PU may be connected to each other. As another example, the connection wiring portion LI and the protrusion portion PU may respectively include different materials.

According to an embodiment of the inventive concept, the column wiring unit 200 may extend from the pixel array 100, and at least one column routing wire RT of the column wiring unit 200 may include the connection wiring portion LI and the protrusion portion PU, and at least another column routing wire RT of the column wiring unit 200 may include only the connection wiring portion LI. For example, the at least another column routing wiring RT may not include the protrusion portion PU. In this case, a length of the at least one column routing wiring RT may be substantially the same as a length of the at least another column routing wiring RT. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

In this case, a length of the connection wiring portion LI of the column routing wiring RT that includes the protrusion portion PU may be less than a length of the connection wiring portion LI of the column routing wire RT that does not include the protrusion portion PU. In addition, the protrusion portions PU included in at least some of the column routing wires RT may have different lengths.

Figure 3A:
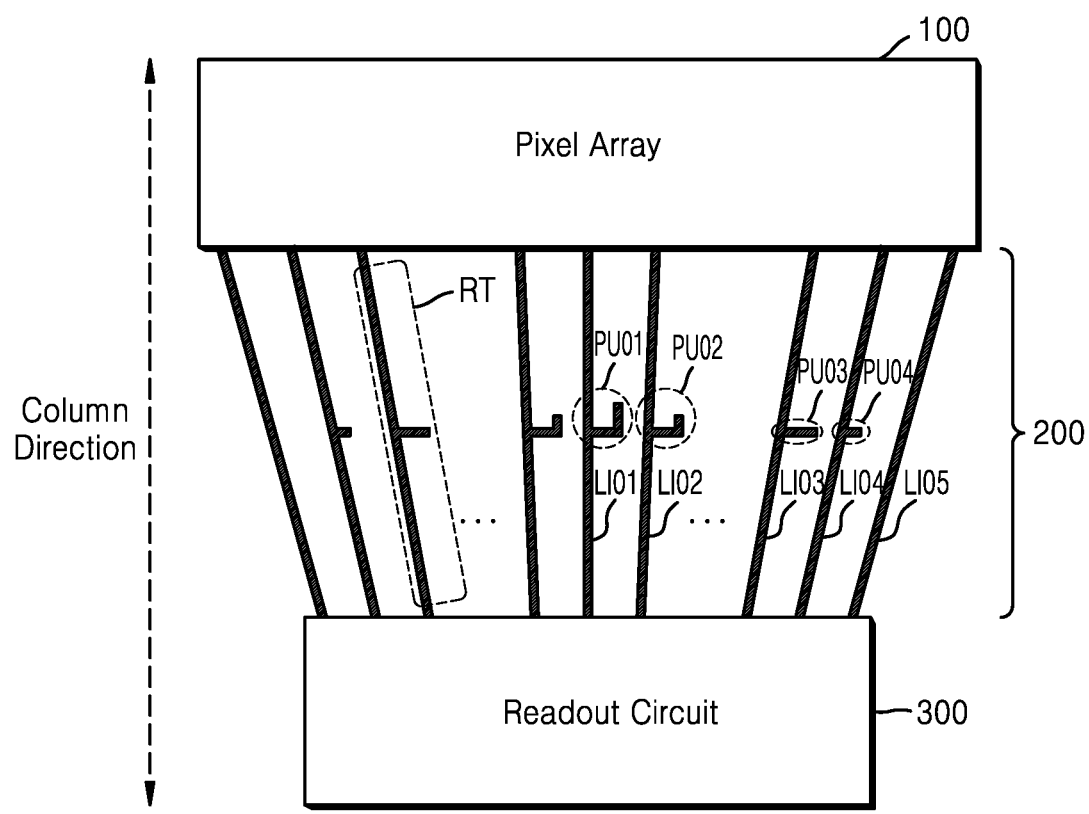
FIGS. 3A and 3B are each a diagram of a wiring unit including a protrusion portion, according to an example embodiment of the inventive concept.
Figure 3B:
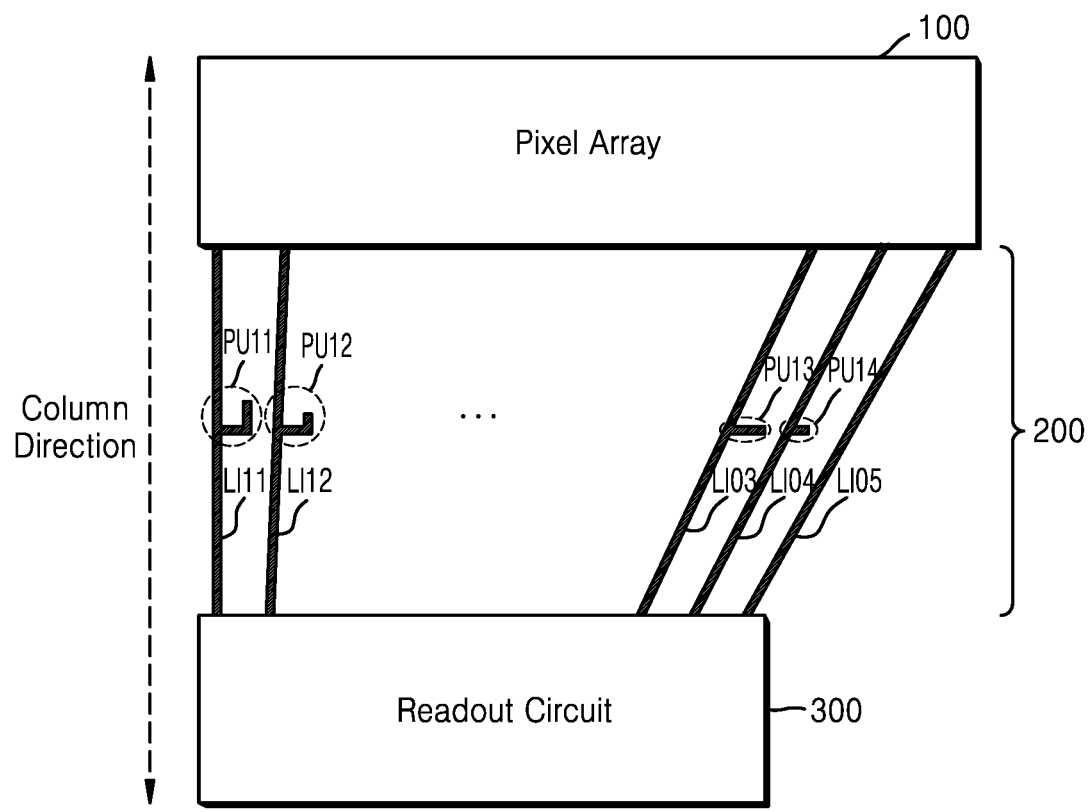

FIGS. 3A and 3B are each a diagram of the column wiring unit 200 including protrusions, according to an example embodiment of the inventive concept.

Referring to FIGS. 3A and 3B, at least some of the column routing wires RT may include the protrusion portions PU having different lengths. As the connection wiring portion LI is shorter, the column routing wire RT may include the protrusion portion PU having a greater length. For example, the column routing wire RT including a connection wiring portion LI01 may include a protrusion portion PU01 having a greatest length, and the column routing wire RT including a connection wiring portion LI05 may not include a protrusion PU. A connection wiring portion LI04 may be arranged adjacent to the connection wiring portion LI05 having the greatest length. In this case, a column routing wire RT that includes the connection wiring portion LI04 may include a protrusion portion PU04 having a smallest length. In some embodiments, the lengths of the protrusions portions PU may vary inversely to the length of the connection wiring portion LI. For example, the connection wiring portions LI having the shorter lengths may have protrusion portions PU having greater lengths, and the connection wiring portions LI having greater lengths may have protrusion portions PU having smaller lengths.

According to an embodiment of the inventive concept, the column routing wire RT that includes the connection wiring portion LI01 with the smallest length may be arranged adjacent to the central region of the pixel array 100 or the readout circuit 300. For example, the column routing wire RT may be connected to the pixel PX arranged in the central region of the pixel array 100. The column routing wire RT that includes the connection wiring portion LI05 with the greatest length may be connected to the pixel PX arranged in the side region of the pixel array 100.

Referring to FIG. 3A, a length of the connection wiring portion LI included in the column routing wire RT may increase away from the central region of the pixel array 100 and/or the readout circuit 300. Accordingly, a length of the protrusion portion PU included in the column routing wire RT may gradually decrease. For example, the protrusion portion PU01 may be formed in a right angle in the connection wiring portion LI01 with the smallest length, and a protrusion portion PU03 may be formed in the form of a straight line in the connection wiring portion LI03 with a greater length.

Referring to FIG. 3B, a length of the connection wiring portion LI included in the column routing wire RT may increase away from a left side of the pixel array 100 or the readout circuit 300. Unlike in FIG. 3A, the readout circuit 300 may be arranged to correspond to a side of the pixel array 100. The length of the protrusion portion PU may decrease as the length of the connection wiring portion LI corresponding thereto increases. For example, in the embodiment of FIG. 3B, the column routing wire RT on the furthest left side may have the shortest connection wiring portion LI and the longest protrusion portion PU, and the column routing wire RT on the furthest right side may have the longest connection wiring portion LI and no protrusion portion PU.

Figure 4:
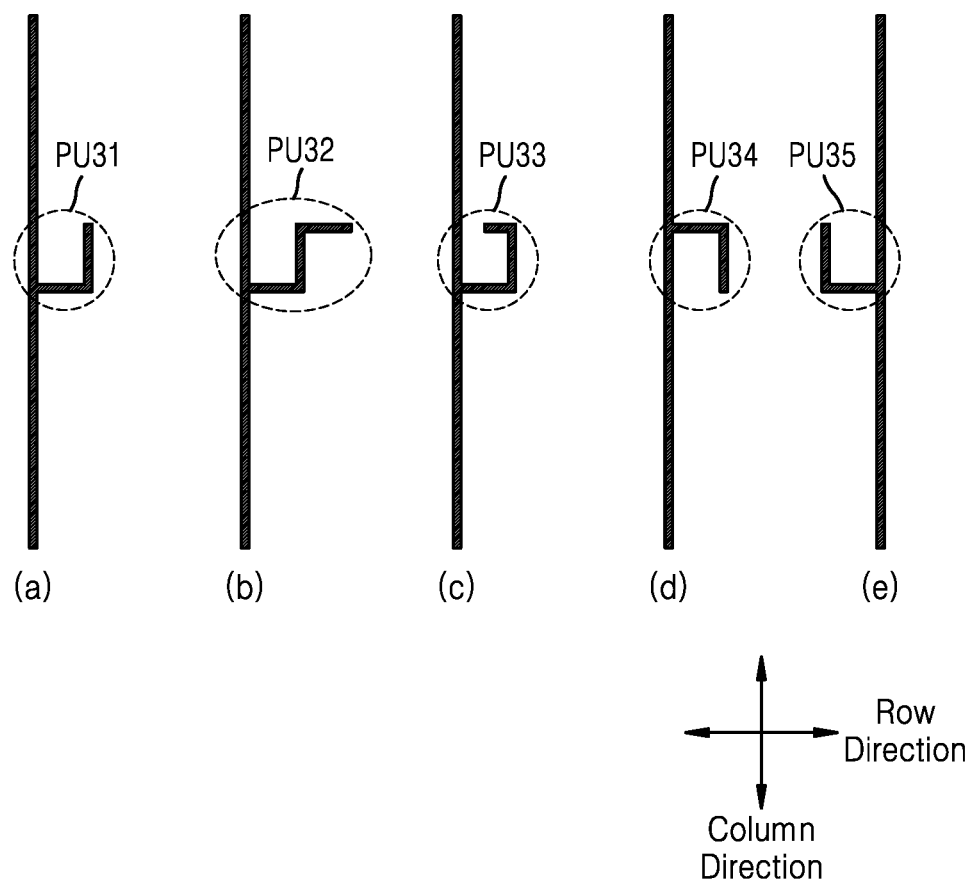
FIG. 4 is a diagram of various shapes of a protrusion portion according to an example embodiment of the inventive concept.

FIG. 4 is a diagram of various shapes of the protrusion portion PU according to an embodiment of the inventive concept.

Referring to FIG. 4, in some cases, the protrusion portion PU may form at least one right angle. However, as described above, in other cases, the protrusion portion PU may be formed in a straight line. For example, when the length of the connection wiring portion LI corresponding to the protrusion portion PU is larger, the protrusion portion PU may be formed in the straight line. This is because, when the connection wiring portion LI is longer, a protrusion portion PU having a smaller length may be sufficient to compensate for the deviation between the lengths of the connection wiring portions LI.

Referring to (a) of FIG. 4, similarly to the descriptions of FIGS. 2, 3A, and 3B, a protrusion portion PU31 may be formed to include one right angle. For example, the protrusion portion PU31 may include two linear segments connected at a right angle to one another, where an end point of one of the linear segments faces the pixel array 100. The two linear segments may have the same length as one another, or they may have different lengths. Referring to (b) of FIG. 4, a protrusion portion PU32 may be formed to include two right angles. For example, the protrusion portion PU32 may include three linear segments connected at two right angles, where the right angles face in opposite directions. The protrusion portion PU32 may be used when the deviation between the longest and shortest lengths of the connection wiring portions LI is large. The three linear segments may have the same length, or they may have different lengths. Referring to (c) of FIG. 4, a protrusion portion PU33 may include two right angles and may be formed into a pattern of curling toward the connection wiring portion LI. For example, the protrusion portion PU33 may include three linear segments connected at two right angles, where the right angles are adjacent to one another. The protrusion portion PU33 may be used when the pitch between column routing wires RT is small. The three linear segments may have the same length, or they may have different lengths. Referring to (d) of FIG. 4, a protrusion portion PU34 may include one right angle, and an end point of the protrusion portion PU34 may face the readout circuit 300. For example, the protrusion portion PU34 may include two linear segments connected at a right angle to one another, where an end point of one of the linear segments faces away from the pixel array 100. The two linear segments may have the same length, or they may have different lengths. Referring to (e) of FIG. 4, a protrusion portion PU35 may be formed to correspond to the protrusion portion PU31 described with reference to (a) of FIG. 4. For example, the protrusion portion PU35 may include two linear segments connected at a right angle to one another, where an end point of one of the linear segments faces the pixel array 100. As illustrated in each of (a) to (e) of FIG. 4, the protrusion portions PU may be connected on one end to the connection wiring portion LI at a right angle, and be floating on the other end. Forms, locations, sizes, and patterns of the protrusion portions PU are not limited thereto, and the protrusion portions PU may be realized in various methods to compensate for deviation between the lengths of the connection wiring portions LI.

Figure 5:
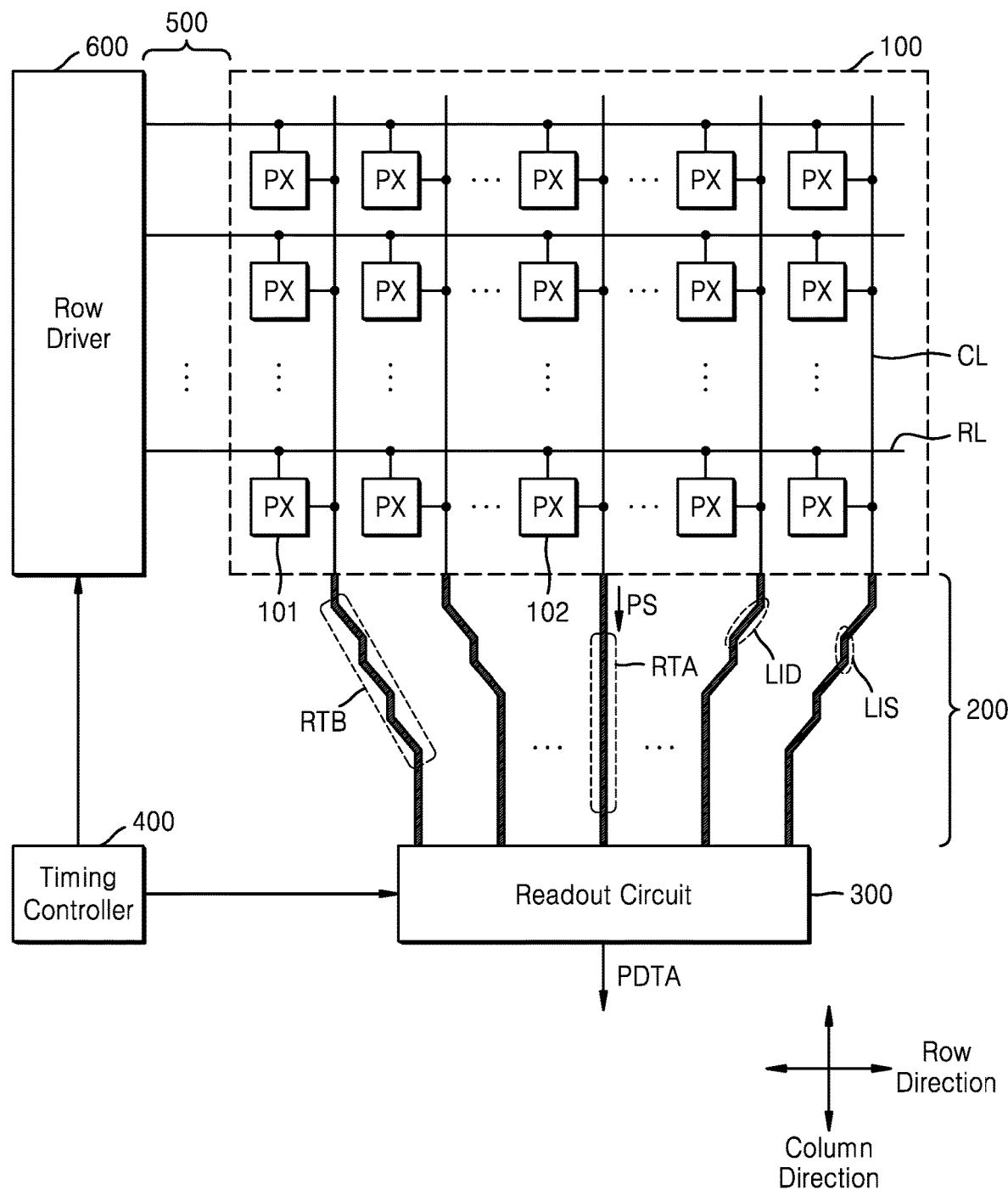
FIG. 5 is a diagram of an image sensor including a partial wiring in a diagonal direction, according to an example embodiment of the inventive concept.

FIG. 5 is a diagram of the image sensor 1 including a partial wire in a diagonal direction, according to an embodiment of the inventive concept.

Referring to FIG. 5, similar to the descriptions discussed in connection with FIGS. 1 and 2, the pixel array 100 may transmit the pixel signal PS to the readout circuit 300 through the column wiring unit 200 based on the control signal received from the timing controller 400.

According to an example embodiment of the inventive concept, the column wiring unit 200 may include column routing wires RTA and RTB. The column routing wire RTA may be formed in a substantially straight line in a column direction, and the column routing wire RTB may include at least one first partial wire LIS formed to extend in the column direction and at least one second partial wire LID formed to extend in a diagonal direction. The at least one first partial wire LIS and the at least one second partial wire LID may formed in straight lines extending in the column and diagonal directions, respectively. Due to processes or cost, a wire may not easily extend in a diagonal line having various angles from the pixel array 100 to the readout circuit 300. Therefore, the second partial wiring LID in the diagonal direction may be appropriately formed to minimize deviation between the lengths of the wires extending from the pixel array 100 to the readout circuit 300.

The column routing wire RTB may be realized as various types of wirings. For example, the first partial wire LIS and the second partial wire LID may be patterned in one configuration. In this case, the first partial wire LIS and the second partial wire LID may be patterned by using the same material (for example, a metal, a high molecular compound, a metal oxide, and the like). As another example, the first partial wire LIS and the second partial wire LID may be realized by connection of individual wirings. As another example, the first partial wires LIS may have the same length, and the second partial wires LID may have the same length. As another example, at least some of the first partial wires LIS may have different lengths, and at least some of the second partial wires LID may have different lengths.

According to an embodiment of the inventive concept, a length of the column routing wire RTA may be less than a length of the column routing wire RTB. In addition, as a length of at least one column routing wire RTB is greater, a total length of at least one second partial wire LID may be greater. For example, for any given column routing wire RTB, the length of the at least one second partial wire LID of the column routing wire RTB may be proportional to the length of the column routing wire RTB. In this case, the at least one second partial wire LID may be provided in a greater number.

In the related art, a right-angle wiring that may be easily used in a process is used in realizing the spider routing structure. For example, the spider routing structure is realized by alternately arranging wire in the row direction and the column direction. However, when the second partial wire LID in the diagonal direction is used, deviation between time constants of the column routing wire RT in the side region and the column routing wiring RT in the central region may be reduced by about 80%. As the deviation between the time constants decreases, settling times of signals transmitted from all the column routing wires RT may be uniform, signal uniformity may be promoted, and thus, pixel noise may be reduced.

Figure 6:
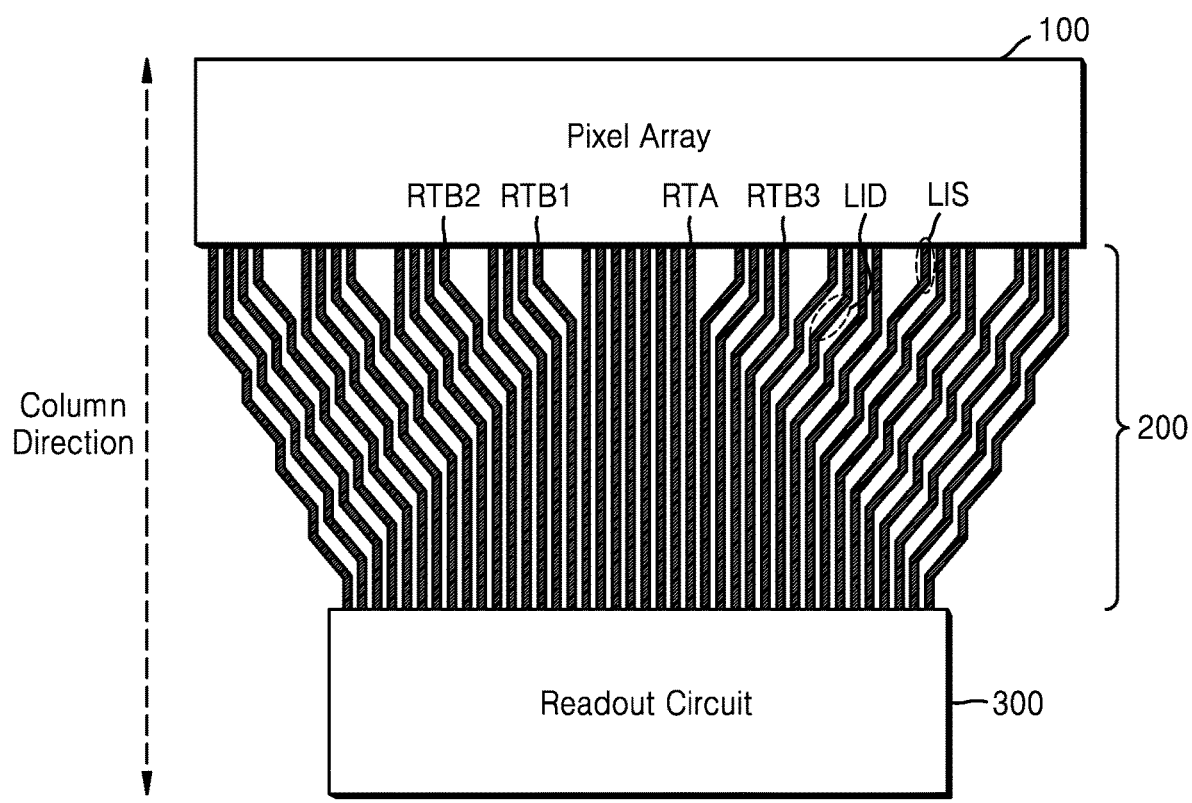
FIG. 6 is a diagram of a wiring unit including a partial wiring in a diagonal direction, according to an example embodiment of the inventive concept.

FIG. 6 is a diagram of the column wiring unit 200 including the partial wires in the diagonal direction, according to an embodiment of the inventive concept.

Referring to FIG. 6, the pixel array 100 and the readout circuit 300 may be arranged with reference to a center. For example, a center of the readout circuit 300 may be aligned with a center of the pixel array 100. The column routing wires RTA connected to the central region of the pixel array 100 and/or the readout circuit 300 may extend straight in the column direction. For example, the plurality of column routing wires RTA may have a same length.

The column routing wired RTB1, RTB2, and RTB3 may include the second partial wires LID and extend from the pixel array 100 to the readout circuit 300. A length of the second partial wire LID included in a column routing wire RTB2 may be greater than a length of the second partial wire LID included in a column routing wire RTB1. Alternatively, the number of second partial wire LID included in the column routing wire RTB2 may be greater than the number of second partial wire LID included in the column routing wire RTB1.

Second partial wires LID included in some of the column routing wires RTB may have the same length. For example, second partial wires LID respectively included in the column routing wires RTB1 and the column routing wires RTB3 may have the same length. In each of the column routing wires RTB1 and the column routing wires RTB3, the lengths of the first partial wires LIS may increase as distance of the column routing wires RTB1 and the column routing wires RTB3 from the center of the pixel array 100 and/or the readout circuit 300 increases. In addition, the numbers of second partial wires LID respectively included in the column routing wire RTB1 and the column routing wires RTB3 may be the same as each other. Referring to column routing wires RTB3, the length of the second partial wires LID may be the same, and the lengths of the first partial wires LIS nearest the pixel array 100 may increase as the distance of the column routing wires RTB3 from the center of the pixel array 100 and/or the readout circuit 300 increases.

Figure 7:
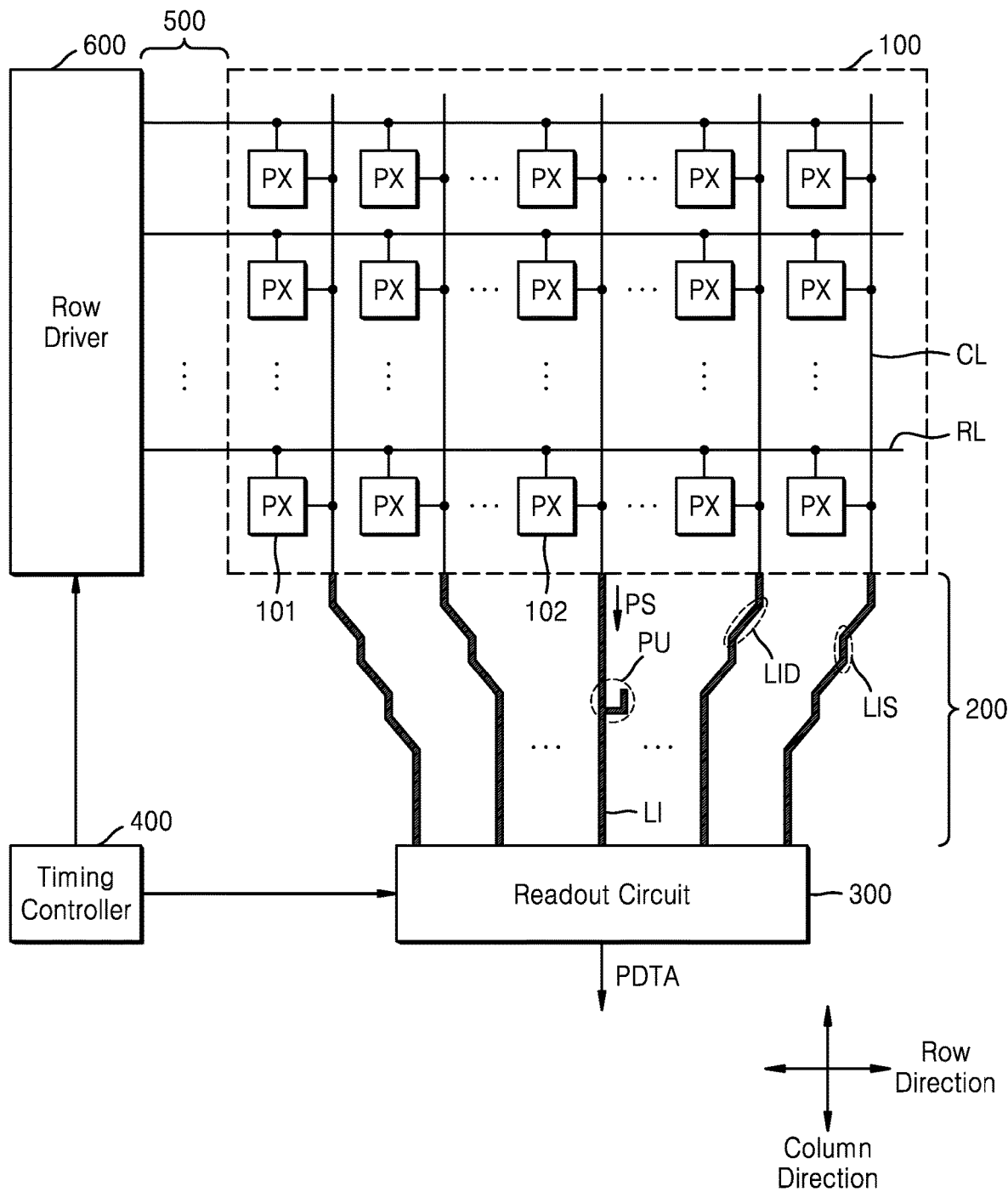
FIG. 7 is a diagram of an image sensor including a protrusion portion and a partial wiring in a diagonal direction, according to an example embodiment of the inventive concept.

FIG. 7 is a diagram of the image sensor 1 including the protrusion portion PU and the partial wire in the diagonal direction, according to an example embodiment of the inventive concept.

Referring to FIG. 7, the column wiring unit 200 may be formed to include the protrusion portion PU and the second partial wiring LID in the diagonal direction, thereby more effectively reducing the deviation between the lengths of the column routing wires RT.

More particularly, the protrusion portion PU may be included in a shortest column routing wire RT and may increase a resistance and capacitance included in the column routing wire RT. Longer column routing wires RT may be patterned to form a partial wire such as the second partial wire LID in the diagonal direction to reduce a resistance and capacitance included in the longer column routing wires RT. The embodiment of FIG. 7 is a combination of the embodiment of the image sensor 1 including the protrusion portion PU described above with reference to FIGS. 1, 2, 3A, 3B, and 4 and the second partial wiring LID described above with reference to FIGS. 5 and 6, and therefore, redundant descriptions thereof will be omitted.

Figure 8:
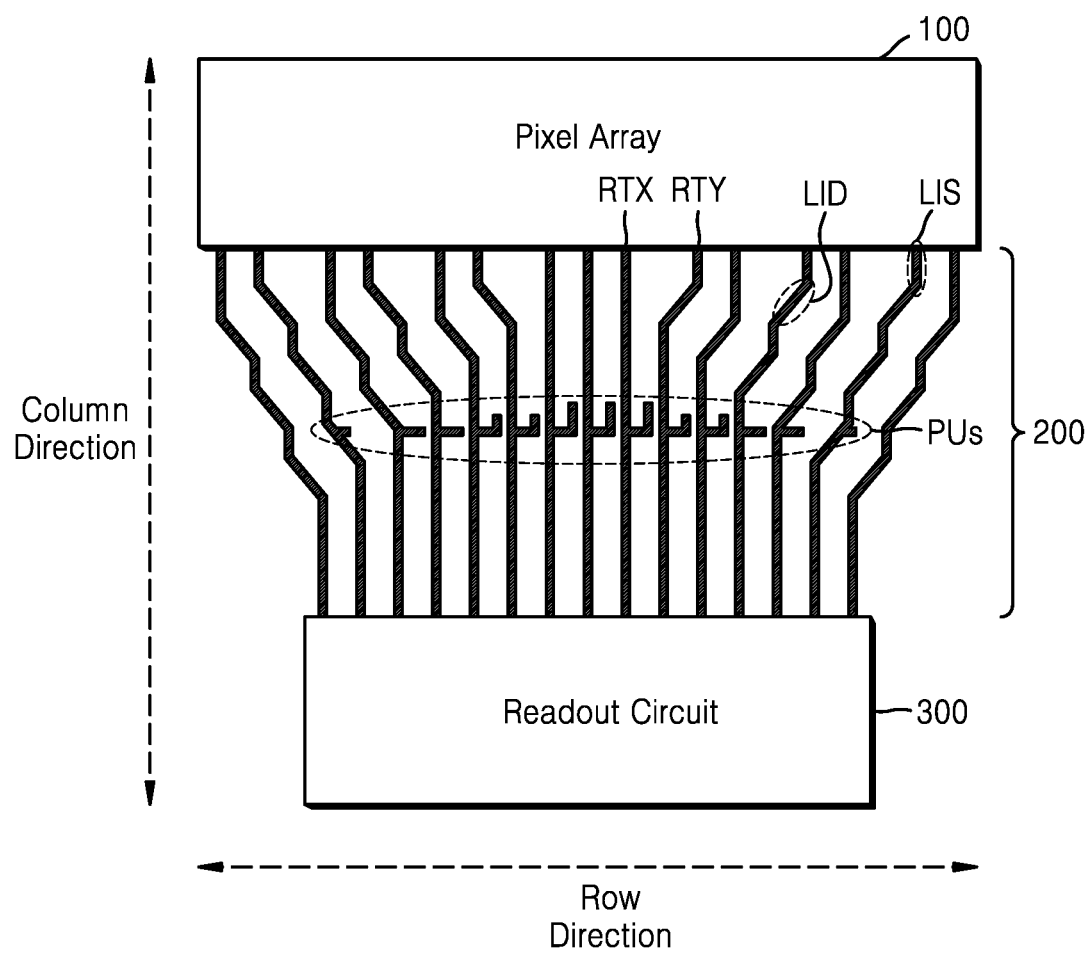
FIG. 8 is a diagram of a wiring unit including a protrusion portion and a partial wiring in a diagonal direction, according to an example embodiment of the inventive concept.

FIG. 8 is a diagram of the column wiring unit 200 including the protrusion portion PU and the partial wires in the diagonal direction, according to an example embodiment of the inventive concept.

Referring to FIG. 8, the column wiring unit 200 may include the protrusion portions PU. For example, column routing wires RTX, except for a column routing wire RTX that has a greatest length, may include the protrusion portions PU.

According to an example embodiment of the inventive concept, the column routing wires RTX formed in straight lines in the column direction from the pixel array 100 may respectively include protrusion portions PU having a same length. Away from the column routing wires RTX in the row direction, the column routing wire RTY may include a shorter protrusion portion PU. For example, each of the column routing wires RTX and RTY may include a protrusion portion PU having two linear segments arranged at right angles to one another, and at least one of the two linear segments of the column routing wire RTY may be shorter than the linear segments of the column routing wire RTX.

At least some of the column routing wires RTX may include the protruding units PU forming at least one right angle. Other column routing wires RTX may include protruding units PU having the form of a straight line. Other column routing wire RTX may not include the protrusion portions PU.

The configuration included in the column wiring unit 200 and the above-mentioned drawings may have various shapes, locations, and angles. Accordingly, the deviation between the lengths of the column routing wires RT may be reduced, signal uniformity may be increased, and noise may be reduced.

Figure 9:
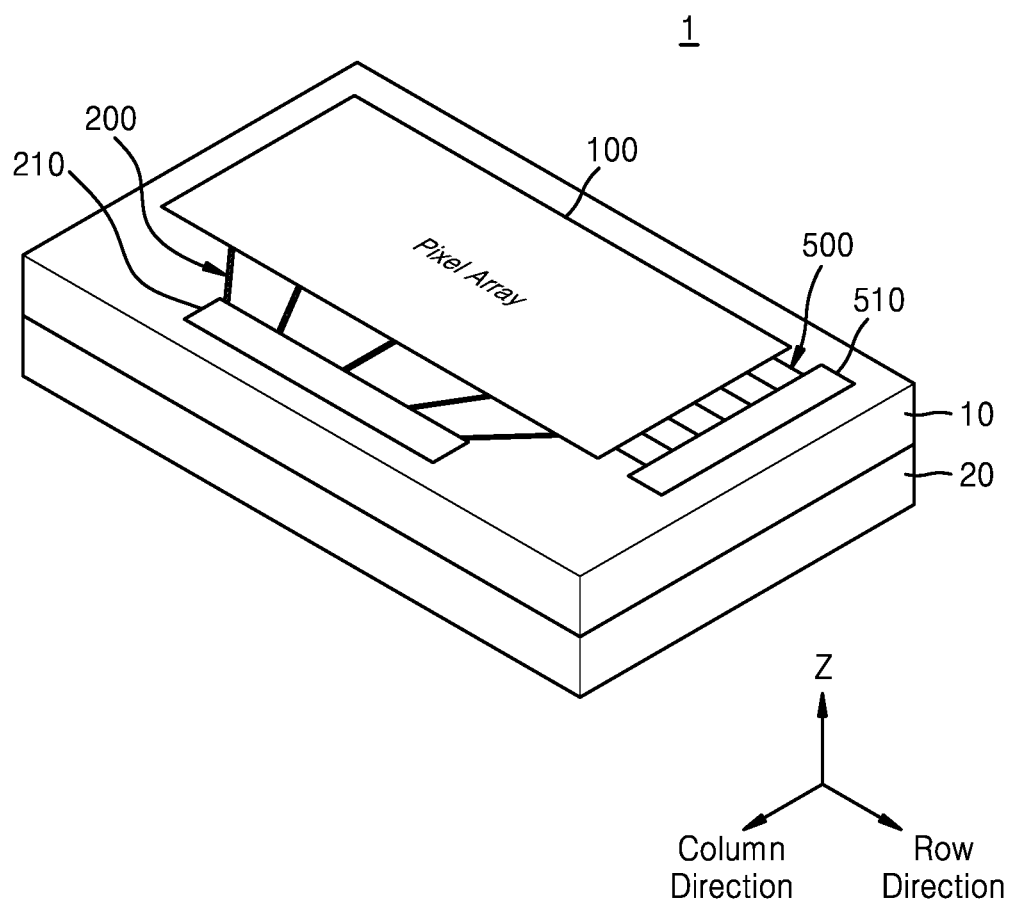
FIG. 9 is a diagram of an image sensor including a stack structure according to an example embodiment of the inventive concept.
Figure 10:
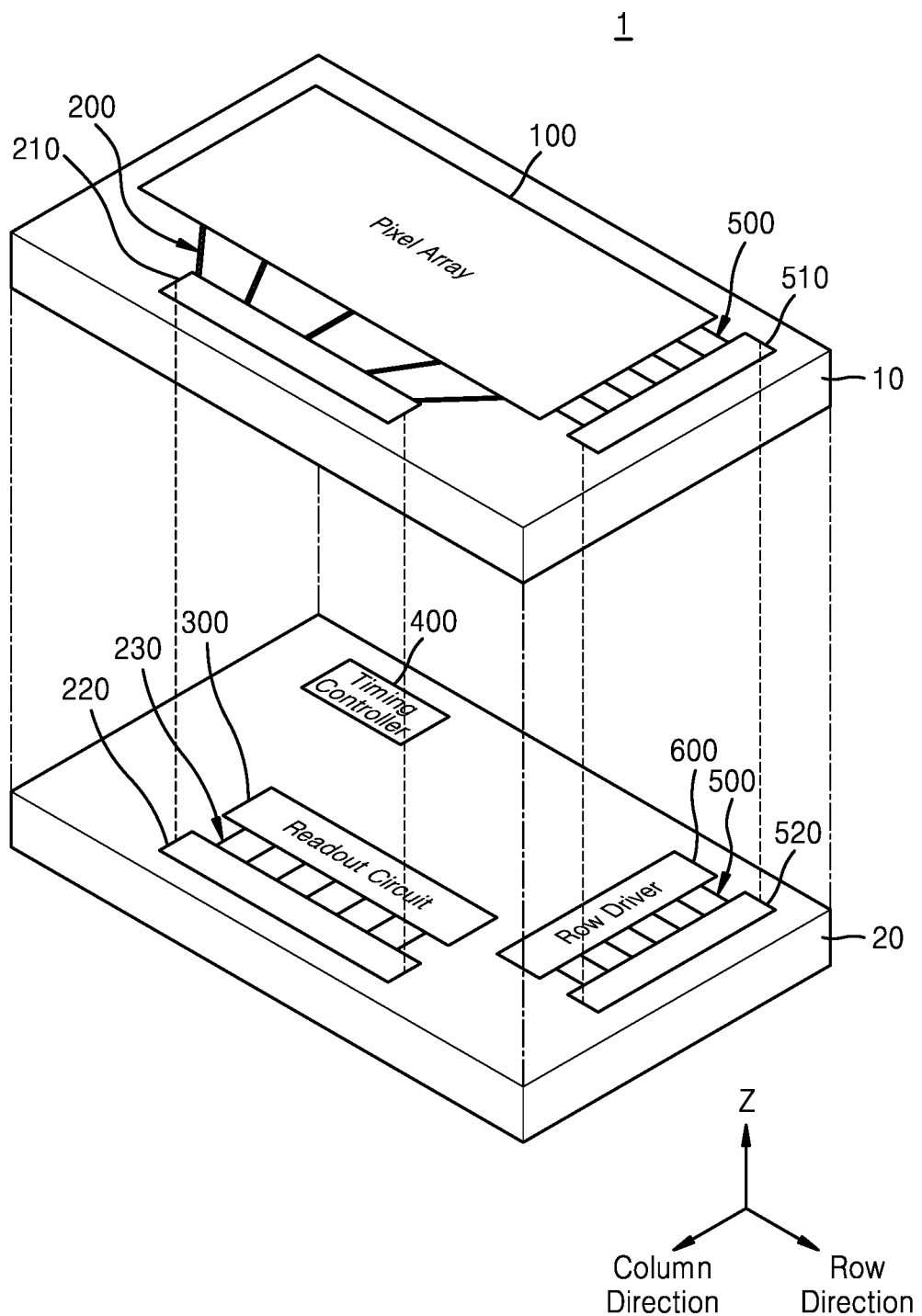
FIG. 10 is an exploded diagram of the image sensor of FIG. 9.

FIG. 9 is a diagram of the image sensor 1 including a stack structure according to an embodiment of the inventive concept, and FIG. 10 is an exploded diagram of the image sensor of FIG. 9.

Referring to FIGS. 9 and 10, the image sensor 1 may include a first semiconductor die 10 and a second semiconductor die 20, and the first semiconductor die 10 and the second semiconductor die 20 may together form a stack structure. For example, the image sensor 1 may be realized as a stacked image sensor. In this case, the image sensor 1 may include the pixel array 100, the column wiring unit 200, a first interlayer connection unit 210, a second interlayer connection unit 220, the readout circuit 300, the timing controller 400, the row wiring unit 500, a third interlayer connection unit 510, a fourth interlayer connection unit 520, and the row driver 600.

Under control of the timing controller 400, a pixel signal generated in the first semiconductor die 10 may be transmitted to the second semiconductor die 20. The pixel array 100 may output the pixel signal, and the column wiring unit 200 may transmit the pixel signal to the first interlayer connection unit 210. The first interlayer connection unit 210 may transmit the pixel signal to the second interlayer connection unit 220 arranged at a position corresponding to that of the first interlayer connection unit 210.

Under control of the timing controller 400, the second semiconductor die 20 may receive the pixel signal from the first semiconductor die 10. The second interlayer connection unit 220 may receive the pixel signal from the first interlayer connection unit 210. The second interlayer connection unit 220 may transmit the pixel signal to the readout circuit 300 through the column wiring unit 230. The readout circuit 300 may, based on the pixel signal, output the pixel data to a configuration (e.g., an image processor) included in or outside of the image sensor 1.

The timing controller 400 may control the row driver 600 to control a timing at which the pixel signal is output from the pixel array 100. For example, the timing controller 400 may transmit a timing control signal to the row driver 600. The row driver 600 may transmit the control signal to the pixel array 100 through the fourth interlayer connection unit 520, the third interlayer connection unit 510, and the row wiring unit 500.

According to an embodiment of the inventive concept, the column wiring unit 200 may be realized by various embodiments described above with reference to the accompanying drawings. For example, at least one of the column routing wires RT included in the column wiring unit 200 may include the protrusion portion PU and/or the second partial wire LID in the diagonal direction. As another example, at least one of the column routing wires RT included in the column wiring unit 230 may include the protrusion portion PU and/or the second partial wire LID. As another example, at least one of the column routing wires RT included in the column wiring unit 200 and the column wiring unit 230 may include the protrusion portion and/or the second partial wire LID. For example, the inventive concept may also be applied to the stacked image sensor.

Figure 11:
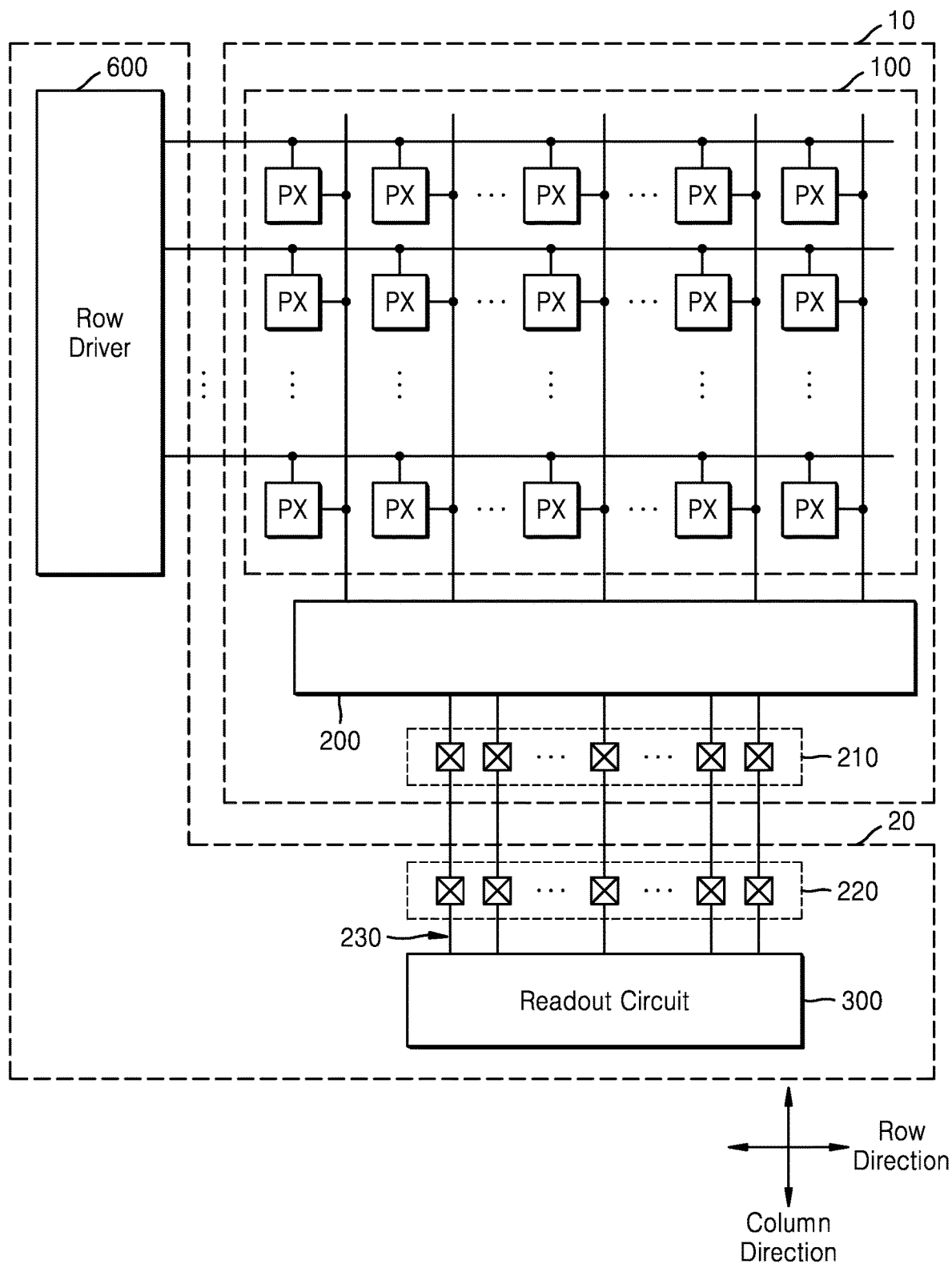
FIG. 11 is a diagram of a first semiconductor die including a protrusion portion and/or a second partial wiring in a diagonal direction according to an example embodiment of the inventive concept.

FIG. 11 is a diagram of the first semiconductor die 10 including the protrusion portion PU and/or the second partial wire LID in the diagonal direction.

Referring to FIG. 11, the column wiring unit 200 is shown as an empty block, which is merely for convenience of explanation, and the empty block may include the column wiring unit 200 shown in FIG. 2, 5, or 7 together with the protrusion portion PU and/or the second partial wire LID in the diagonal direction.

According to an example embodiment of the inventive concept, a row-direction length of the first interlayer connection unit 210 may correspond to a row-direction length of the readout circuit 300. In this case, as the length of the pixel array 100 is different from the length of the first interlayer connection unit 210, the column wiring unit 200 may be realized as the spider routing structure, and to reduce deviation between the lengths of the column routing wires RT, the column wiring unit 200 may include the protrusion portion PU and/or the second partial wire LID according to an embodiment of the inventive concept.

According to an embodiment of the inventive concept, the pixel signal output from the plurality of pixels PX may be transmitted to the first interlayer connection unit 210 through the column wiring unit 200 that includes the protrusion portion PU and/or the second partial wire LID. The first interlayer connection unit 210 and the second interlayer connection unit 220 may be realized as various forms such as a data pad, a data pin, a metal contact, a conductive wire, and a conductive pattern capable of connecting the first semiconductor die 10 to the second semiconductor die 20 to transmit a signal. The readout circuit 300 may receive the pixel signal through the column wiring unit 200, the first interlayer connection unit 210, and the second interlayer connection unit 220.

Figure 12:
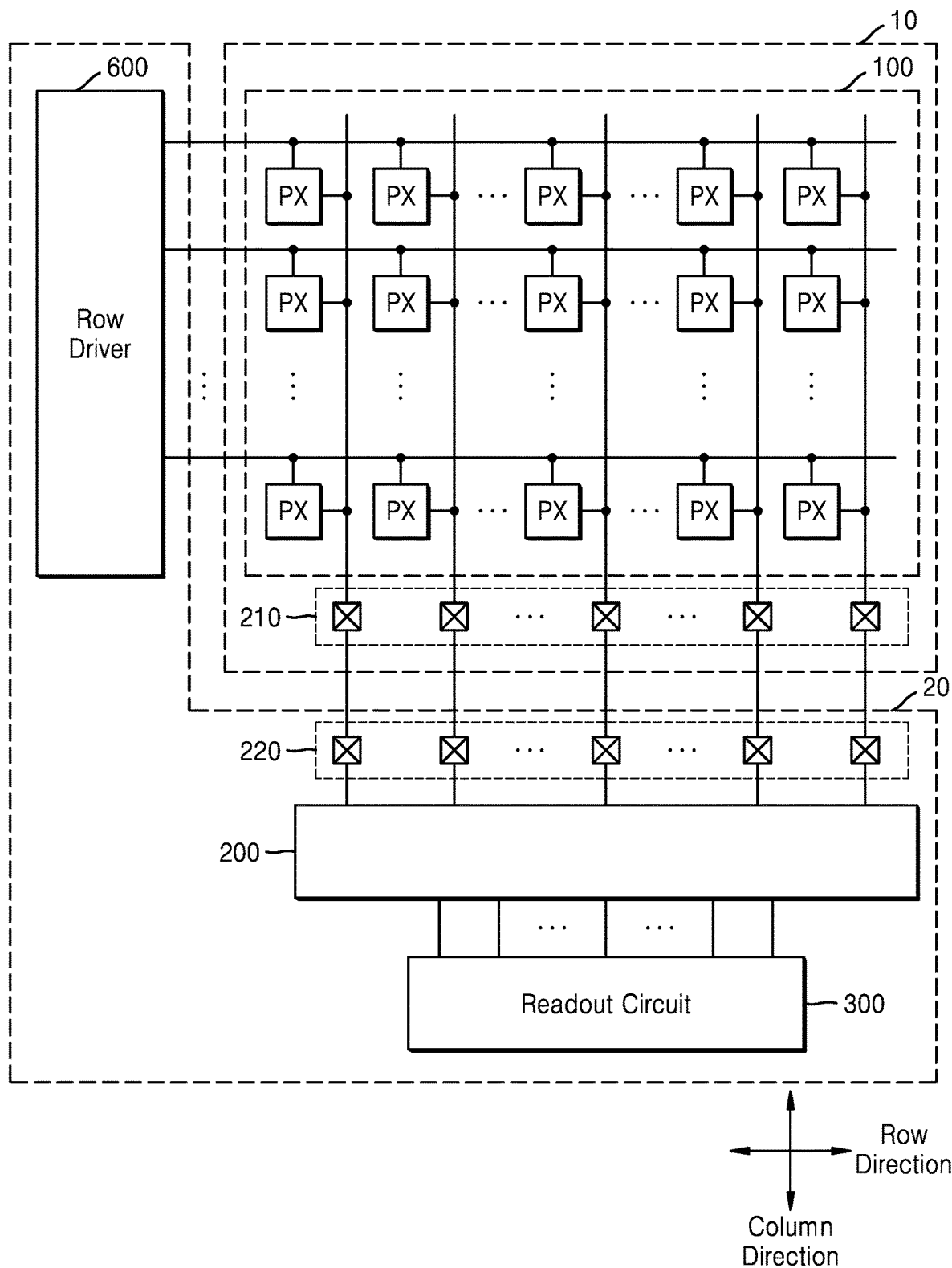
FIG. 12 is a diagram of a second semiconductor die including a protrusion portion and/or a second partial wiring in a diagonal direction according to an example embodiment of the inventive concept.

FIG. 12 is a diagram of the second semiconductor die 20 including the protrusion portion PU and/or the second partial wire LID in the diagonal direction, according to an example embodiment of the inventive concept.

Referring to FIG. 12, the column wiring unit 200 is shown as an empty block, which is merely for convenience of explanation, and the empty block may include the protrusion portion PU and/or the second partial wire LID in the diagonal direction as in the column wiring unit 200 in FIG. 2, 5, or 7.

According to an embodiment of the inventive concept, row-direction lengths of the first interlayer connection unit 210 and the second interlayer connection unit 220 may correspond to a row-direction length of the pixel array 110. A row-direction length of the readout circuit 300 may be less than the row-direction length of the pixel array 110. In this case, as the length of the second interlayer connection unit 220 is different from the length of the readout circuit 300, the column wiring unit 200 may be realized as the spider routing structure, and to reduce deviation between the lengths of the column routing wires RT, the column wiring unit 200 may include the protrusion portion PU and/or the second partial wire LID according to an embodiment of the inventive concept.

According to an embodiment of the inventive concept, pixel signals output from the plurality of pixels PX may be transmitted to the column wiring unit 200 that includes the protrusion portion PU and/or the second partial wire LID via the first interlayer connection unit and the second interlayer connection unit 220. The pixel signal may be transmitted to the readout circuit 300 through the column wiring unit 200. The first interlayer connection unit 210 and the second interlayer connection unit 220 may be realized as various forms capable of connecting the first semiconductor die 10 to the second semiconductor die 20 to transmit a signal.

Figure 13:
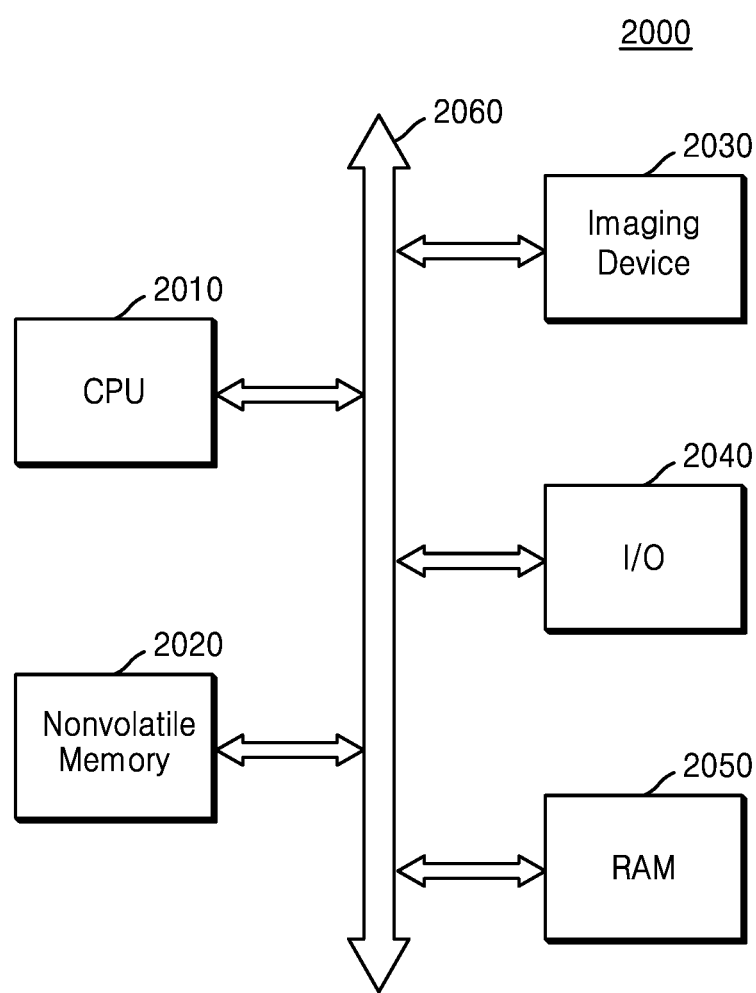
FIG. 13 is a block diagram of an image processing system according to an example embodiment of the inventive concept.

FIG. 13 is a block diagram of an image processing system 2000 according to an example embodiment of the inventive concept.

The image processing system 2000 of FIG. 13 may include any device or system that utilizes image data. For example, the image process system 2000 may include a computer system, a camera system, a scanner, a vehicle navigation system, a video phone, a security system, and a movement detecting system requiring image data. Referring to FIG. 13, the image processing system 2000 may include a central processing unit (CPU) or a processor 2010, a nonvolatile memory 2020, an imaging device 2030 including an image sensor, an input/output (I/O) device 2040, and random access memory (RAM) 2050. The central processing unit or the processor 2010 may communicate with the nonvolatile memory 2020, the imaging device 2030, the I/O device 2040, and the RAM 2050 through a bus 2060.

The central processing unit or the processor 2010 included in the image processing system 2000 of FIG. 13 may control all operations of the imaging device 2030. The imaging device 2030 may include the image sensor that is described above according to the embodiments of the inventive concept. For example, the image sensor included in the imaging device 2030 may be the image sensor 1 including the first semiconductor die 10 and the second semiconductor die 20. The imaging device 2030 may perform various image processing based on pixel data output from the readout circuit 300 to output image data. The image data output from the imaging device 2030 may be transmitted to the central processing unit or processor 2010, the nonvolatile memory 2020, the I/O device 2040, and the RAM 2050 through the bus 2060.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

While the inventive concept has been particularly shown and described with reference to embodiments thereof, it will be understood that various changes in form and details may be made therein without departing from the spirit and scope of the following claims.

What is claimed is:

1. An image sensor comprising:
a pixel array configured to output a pixel signal;
a column wiring unit extending from the pixel array and comprising a first column routing wire comprising a first connection wiring portion and a protrusion portion, and a second column routing wire comprising a second connection wiring portion, wherein a sum of lengths of the first connection wiring portion and the protrusion portion of the first column routing wire is the same as a length of the second connection wiring portion of the second column routing wire; and
a readout circuit configured to receive the pixel signal output from the column wiring unit.

2. The image sensor of claim 1, wherein the length of the first connection wiring portion is less than the length of the second connection wiring portion.

3. The image sensor of claim 2, further comprising:
a third column routing wire comprising a third connection wiring portion and a protrusion portion,
wherein the protrusion portion of the first column routing wire has a different length than the protrusion portion of the third column routing wire.

4. The image sensor of claim 3, wherein the first column routing wire comprises the protrusion portion having a length that increases as the length of the first connection wiring portion decreases.

5. The image sensor of claim 1,
wherein the protrusion portion of the first column routing wire comprises linear segments forming at least one right angle.

6. The image sensor of claim 5, further comprising:
a plurality of connection wiring portions, the first connection wiring portion being one of the plurality of connection wiring portions,
wherein a connection wiring portion of the plurality of connection wiring portions having a shortest length is connected to a pixel arranged in a central region of the pixel array.

7. The image sensor of claim 5, further comprising:
a plurality of connection wiring portions, the first connection wiring portion being one of the plurality of connection wiring portions,
wherein a connection wiring portion of the plurality of connection wiring portions having a longest length is connected to a pixel arranged in a boundary region of the pixel array.

8. The image sensor of claim 1,
wherein the first column routing wire and the second column routing wire are arranged adjacently, and
wherein the protrusion portion is formed between the first column routing wire and the second column routing wire.

9. The image sensor of claim 1, further comprising:
a first semiconductor die comprising the pixel array, the column wiring unit, and a first interlayer connection unit outputting the pixel signal of the pixel array through the column wiring unit; and
a second semiconductor die stacked with the first semiconductor die and comprising a second interlayer connection unit, which communicates with the first interlayer connection unit, and the readout circuit receiving the pixel signal of the pixel array through the second interlayer connection unit.

10. The image sensor of claim 1, further comprising:
a first semiconductor die comprising the pixel array and a first interlayer connection unit outputting the pixel signal received from the pixel array; and
a second semiconductor die stacked with the first semiconductor die and comprising a second interlayer connection unit, the column wiring unit, which communicates with the second interlayer connection unit, and the readout circuit receiving the pixel signal of the pixel array through the column wiring unit.

11. The image sensor of claim 1,
wherein the first column routing wire is formed to extend in a column direction and the second column routing wire comprises a first partial wire extending in the column direction and a second partial wire extending in a diagonal direction.

12. An image sensor comprising:
a pixel array configured to output a pixel signal and comprising a plurality of pixels arranged in rows and columns;
a column wiring unit comprising a first column routing wire formed in a column direction, and a second column routing wire comprising at least one first partial wire formed in the column direction and at least one second partial wire formed in a diagonal direction; and
a readout circuit configured to receive the pixel signal output from the column wiring unit,
wherein the at least one first partial wire is formed between the at least one second partial wire and the readout circuit.

13. The image sensor of claim 12, wherein a length of the first column routing wire is less than a length of the second column routing wire.

14. The image sensor of claim 13, wherein the second partial wire has a total length that increases as the length of the second column routing wire increases.

15. The image sensor of claim 14, further including:
a third column routing wire comprising at least one third partial wire formed in the column direction and at least one fourth partial wire formed in a diagonal direction,
wherein lengths of the second and fourth partial wires are the same.

16. The image sensor of claim 12, further comprising:
a first semiconductor die comprising the pixel array, the column wiring unit, and a first interlayer connection unit outputting the pixel signal of the pixel array through the column wiring unit; and
a second semiconductor die stacked with the first semiconductor die and comprising a second interlayer connection unit, which communicates with the first interlayer connection unit, and the readout circuit receiving the pixel signal of the pixel array through the second interlayer connection unit.

17. The image sensor of claim 12, further comprising:
a first semiconductor die comprising the pixel array and a first interlayer connection unit outputting the pixel signal received from the pixel array; and
a second semiconductor die comprising a second interlayer connection unit stacked with the first semiconductor die and communicating with the first interlayer connection unit, the column wiring unit communicating with the second interlayer connection unit, and the readout circuit receiving the pixel signal of the pixel array through the column wiring unit.

18. A system comprising:
a processor; and
an image sensor controlled by the processor,
wherein the image sensor comprises:
- a first semiconductor die comprising a pixel array configured to output a pixel signal, a first column wiring unit configured to transmit the pixel signal, and a first interlayer connection unit configured to transmit the pixel signal received from the first column wiring unit; and
- a second semiconductor die comprising a second interlayer connection unit configured to receive the pixel signal from the first interlayer connection unit, a second column wiring unit configured to transmit the pixel signal received from the second interlayer connection unit, and a readout circuit configured to receive the pixel signal from the second column wiring unit, wherein at least one wiring from wirings included in the first column wiring unit and the second column wiring unit comprises a protrusion portion.

19. The system of claim 18,
wherein the wirings included in the first column wiring unit and the second column wiring unit comprise at least one first column routing wire comprising a first connection wiring portion and the protrusion portion and at least one second column routing wire comprising a second connection wiring portion.

20. The system of claim 18,
wherein the wirings included in the first column wiring unit and the second column wiring unit formed in a column direction comprise at least one second column routing wire comprising at least one first partial wire formed in the column direction and at least one second partial wire formed in the diagonal direction.

* * * * *